(12) United States Patent
Nonaka et al.

(10) Patent No.: US 7,784,515 B2
(45) Date of Patent: Aug. 31, 2010

(54) SHEET STICKING APPARATUS AND STICKING METHOD

(75) Inventors: Hideaki Nonaka, Tokyo (JP); Kenji Kobayashi, Tokyo (JP)

(73) Assignee: Lintec Corporation, Tokyo (JP)

( * ) Notice: Subject to any disclaimer, the term of this patent is extended or adjusted under 35 U.S.C. 154(b) by 22 days.

(21) Appl. No.: 11/997,098

(22) PCT Filed: Jul. 27, 2006

(86) PCT No.: PCT/JP2006/314852

§ 371 (c)(1),
(2), (4) Date: Jan. 28, 2008

(87) PCT Pub. No.: WO2007/018041

PCT Pub. Date: Feb. 15, 2007

(65) Prior Publication Data

US 2008/0236734 A1 Oct. 2, 2008

(30) Foreign Application Priority Data

Aug. 11, 2005 (JP) .............................. 2005-232943

(51) Int. Cl.
*B29C 65/00* (2006.01)
(52) U.S. Cl. .................... 156/510; 156/380.7; 156/516; 156/250
(58) Field of Classification Search .................. 156/510, 156/380.7, 250; 269/37; 83/43, 597
See application file for complete search history.

(56) References Cited

U.S. PATENT DOCUMENTS 5,759,336 A * 6/1998 Yamamoto et al. ........ 156/379.6
6,235,144 B1 * 5/2001 Yamamoto et al. .......... 156/344
2002/0173229 A1 * 11/2002 Kobayashi ..................... 451/5
2003/0005662 A1 * 1/2003 Ishii et al. ...................... 53/54
2003/0133762 A1 * 7/2003 Yamamoto et al. .......... 406/198
2005/0072517 A1 * 4/2005 Yamamoto .................. 156/250
2005/0126694 A1 * 6/2005 Yamamoto .................. 156/247
2007/0131344 A1 * 6/2007 Tsujimoto et al. ........... 156/248

FOREIGN PATENT DOCUMENTS

JP       2919938 B2    4/1999
JP    2000-128555    * 5/2000

(Continued)

OTHER PUBLICATIONS

PCT/JP2006/314852 International Search Report.

*Primary Examiner*—Khanh Nguyen
*Assistant Examiner*—Vishal I Patel
(74) *Attorney, Agent, or Firm*—Lowe Hauptman Ham & Berner LLP (57) ABSTRACT

Wafers W are supported respectively on inner tables 52 of a table 13, and after a strip of sheet S is fed out to the upper surface side of the wafers W, a press roller 14 imparts a press force. The adhesive sheet S is cut along the outer periphery of the wafers by a cutter blade 63 mounted at the free-end side of a robot 15. The robot 15 has a function to exchange the cutter blade 63 with a suction arm 100, to transfer the wafer W from a magazine 200 to the table 13 and to transfer the wafer W stuck with the sheet to the next process.

3 Claims, 6 Drawing Sheets

FOREIGN PATENT DOCUMENTS

| | | | |
|---|---|---|---|
| JP | 2002-190457 A | 7/2002 | |
| JP | 2003-257898 | * | 9/2003 |
| JP | 2003-257898 A | 9/2003 | |
| JP | 2004-047976 | * | 2/2004 |
| JP | 2005-198806 A | 7/2005 | |
| JP | 2007-019239 A | 1/2007 | |

* cited by examiner

SHEET STICKING APPARATUS AND STICKING METHOD

RELATED APPLICATIONS

The present application is based on, and claims priority from, International Application No. PCT/JP2006/314852, filed Jul. 27, 2006, and Japan Application Number 2005-232943, filed Aug. 11, 2005, the disclosures of which are hereby incorporated by reference herein in their entirety.

FIELD OF THE INVENTION

The present invention relates to a sheet sticking apparatus and a sticking method, particularly to a sheet sticking apparatus and a sticking method capable of sticking a sheet to a plurality of plate-like objects substantially simultaneously, and cutting the sheet along the outer periphery of the plate-like objects.

BACKGROUND OF THE ART

Conventionally, semiconductor wafer (hereinafter, simply referred to as "wafer") is stuck with a protective sheet for protecting circuit surface thereof, and stuck with a heat sensitive adhesive sheet on the rear surface or front surface thereof.

As a sheet sticking method as described above, the following method is known. That is, using a raw strip sheet in which a strip of sheet such as the protective sheet, an adhesive sheet and the like is temporarily stuck on a strip of release liner, the sheet is peeled off from the release liner, stuck onto a wafer, and then cut off along the periphery of the wafer; thus the sheet is stuck onto the wafer (refer to, for example, patent document 1).

Patent document 1: Japanese Patent Application Laid-Open No. 2003-257898

SUMMARY OF THE INVENTION

Problem to be Solved by the Invention

However, the cutting device disclosed in the patent document 1 adopts such an arrangement that the sheet is fed out and stuck to the wafer in a state that one wafer is supported on a table. Therefore, there is such a disadvantage that the sheet cannot be stuck to a plurality of plate-like objects substantially simultaneously. That is, different from silicone wafers, the tendency toward the large size of compound semiconductor wafers has not progressed yet. However, owing to the increase of performance of LEDs (light emitting diode), the need for the small size wafers is getting increased. However, even when sheet sticking apparatus for processing large size wafers is applied to as it is, the advantage of scale thereof cannot be obtained.

OBJECT OF THE INVENTION

The present invention has been proposed in view of the above disadvantage. It is an object of the present invention to provide a sheet sticking apparatus and a sticking method capable of sticking a sheet to a plurality of plate-like objects substantially simultaneously.

Means for Solving Problems

To achieve the above object, the present invention adopts such an arrangement that a sheet sticking apparatus, comprising:

a table for supporting plate-like objects;
a sheet feed-out unit for feeding out a strip of sheet to upper surface sides of the plate-like objects supported by the table;
a press roller for pressing the sheet to stick the same to the plate-like objects; and
cutting means for cutting the sheet along the outer periphery of the plate-like object, wherein
the table is arranged so that a plurality of plate-like objects can be supported in a substantially identical plane and the sheet can be stuck onto the plate-like objects substantially simultaneously.

In this invention, the cutting means is constituted of a multi-joint robot having a plurality of joints and the joints are controlled by NC.

The table is arranged so as to include an outer table and a plurality of inner tables, and the outer table and inner tables are arranged so as to move in the vertical direction respectively.

Also, the inner tables are arranged so as to move in the vertical direction in accordance with the thickness of the plate-like object using the upper surface of the outer table as the reference position, and the outer table is arranged so as to move in the vertical direction in accordance with the thickness of the sheet using the press surface of the press roller as a reference, thereby the press force of the press roller is maintained at a substantially constant level.

Further, the multi-joint robot may adopt such an arrangement so as to be selectively mounted with a cutter blade and a suction arm to the free-end side thereof, and has a function to transfer the plate-like objects to the table when the suction arm is mounted.

Furthermore, such an arrangement is adopted that inspection means is disposed in the vicinity of the multi-joint robot, and has a function to align the plate-like objects as well as a function to inspect the cutter blades.

Also, the present invention adopts such a sheet sticking method in which, in a state that plate-like objects are supported by a table, a press force is imparted to a strip of sheet fed out to upper surface sides of the plate-like objects and the sheet is cut along the outer peripheries of the respective plate-like objects, comprising the steps of:

imparting a press force to the sheet in a state that a plurality of plate-like objects are supported in a substantially identical plane of the table, and then
cutting the sheet along the outer peripheries of the respective plate-like objects.

EFFECT OF THE INVENTION

According to the present invention, since the sheet can be stuck in a state that a plurality of plate-like objects are supported on the table, a sheet sticking apparatus, the processing capacity of which is largely increased owing to the simultaneous sticking of the sheet, can be provided.

Also, since the outer table and the inner tables are capable of moving in the vertical direction, even when the thickness of the plate-like objects and/or the thickness of the sheet are varied, the sticking accuracy can be maintained constantly by imparting a constant sheet press force.

Further, the cutting device is constituted of the multi-joint robot, and at the free-end side thereof the cutter blade and the suction arm can be mounted selectively. Therefore, a multi-functional cutting device can be obtained which performs both of the functions as a cutting device and as a transferring device, and thereby cost reduction can be achieved.

Furthermore, since the inspection means that has both of the functions of alignment of the wafer and inspection of the cutter blades is disposed in the vicinity of the cutting device, the plate-like objects can be disposed on the table with the direction or orientation thereof being maintained constant, and also defects or the like of the cutter blades can be detected.

EXPLANATION OF REFERENCE NUMERALS

10: sheet sticking apparatus
12: sheet feed-out unit
13: table
14: press roller
15: multi-joint robot (cutting means)
16: camera (inspection means)
51: outer table
52: inner table
62: robot body
63: cutter blade
100: suction arm
200: magazine
S: adhesive sheet
W: wafer (plate-like object)

DESCRIPTION OF THE PREFERRED EMBODIMENTS

Hereinafter, embodiment of the invention will be described with reference to the drawings.

Figure 1:
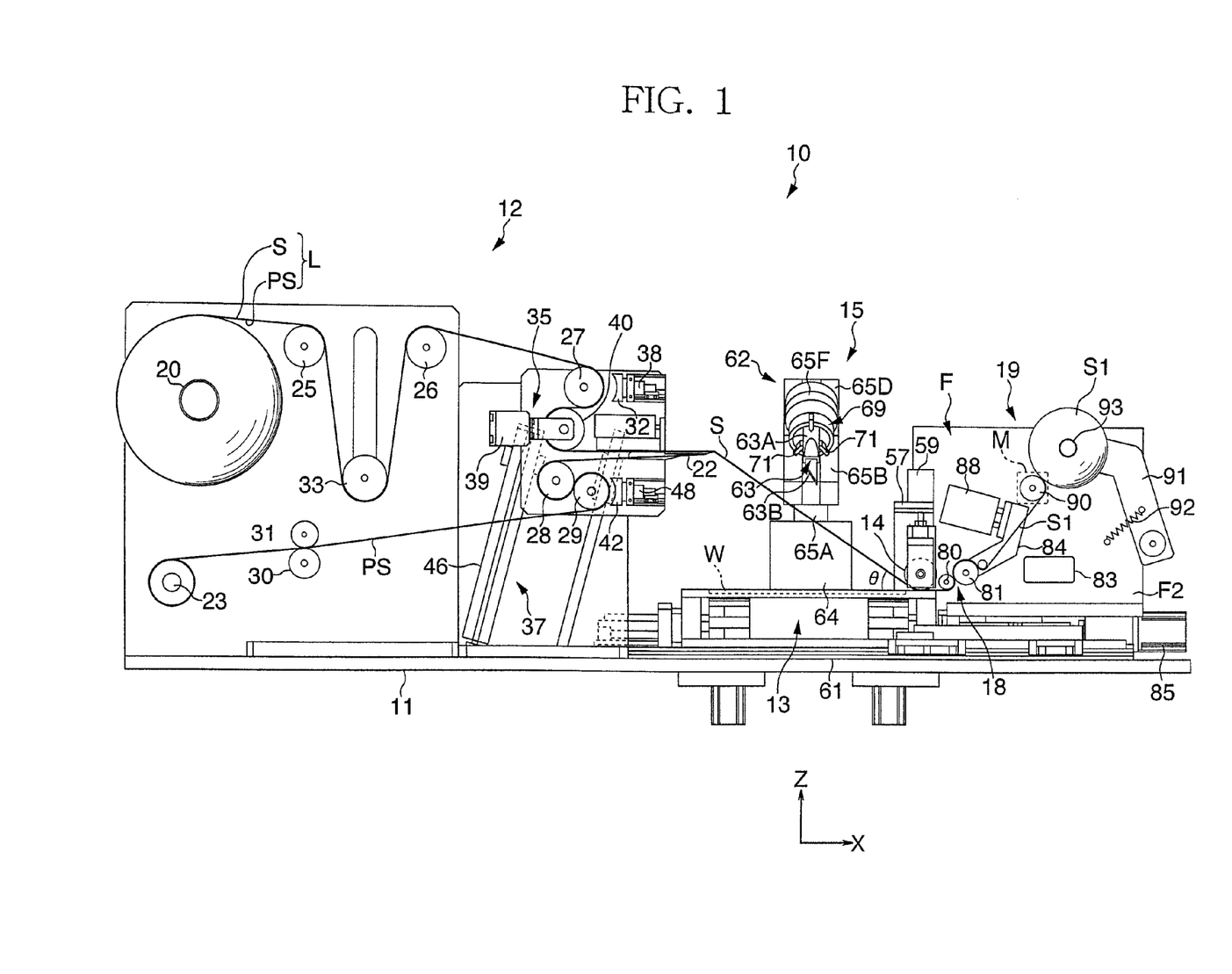
FIG. 1 is a front view schematically showing a sheet sticking apparatus in accordance with an embodiment.
Figure 2:
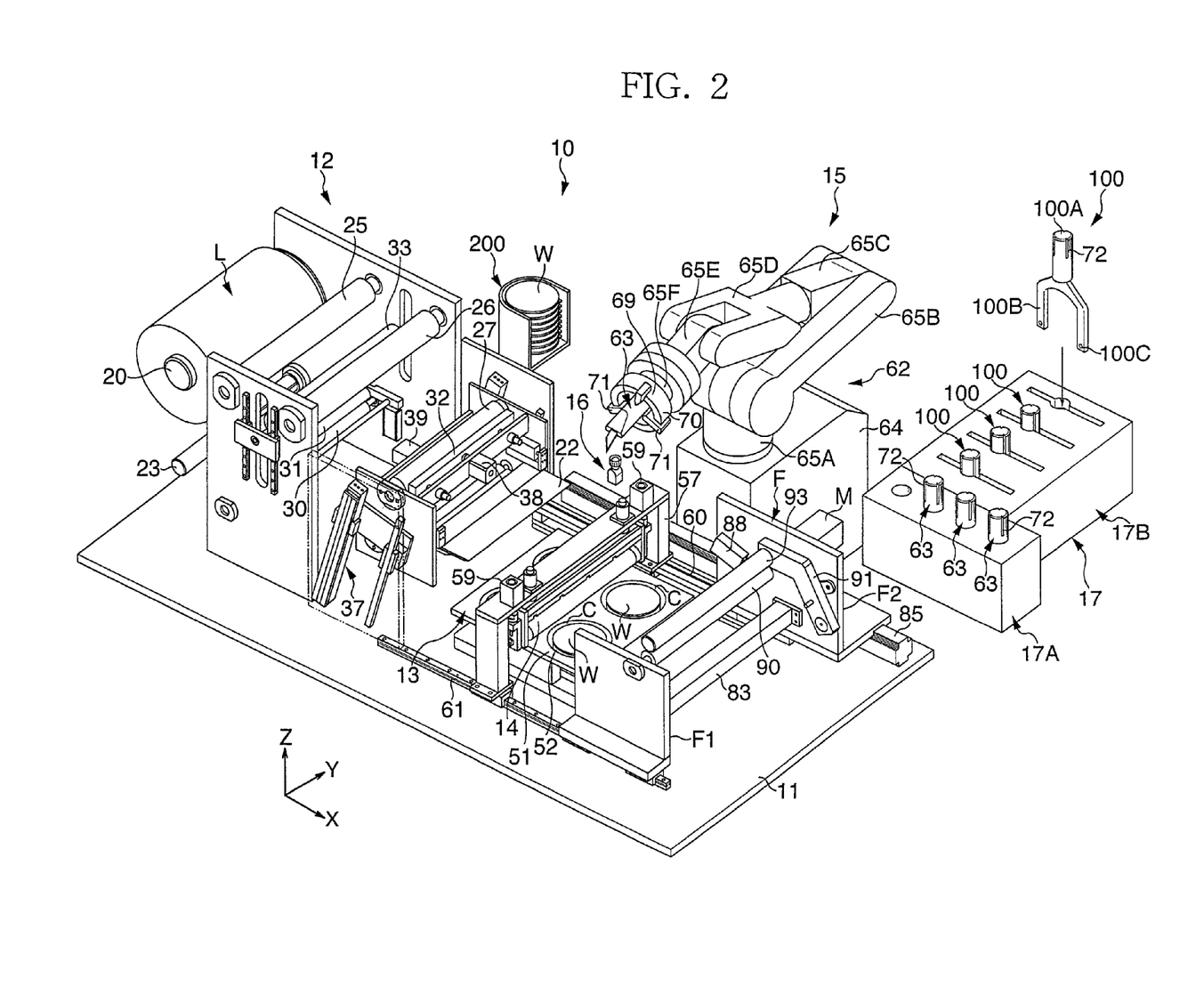
FIG. 2 is a perspective view schematically showing the sheet sticking apparatus.

FIG. 1 is a front view schematically showing a sheet sticking apparatus according to the embodiment; and FIG. 2 is a schematic perspective view thereof. In these figures, a sheet sticking apparatus 10 comprises: a sheet feed-out unit 12 disposed in the upper portion of a base 11; a table 13 for supporting a plurality of wafers W as a plate-like object within a substantially same plane, a press roller 14 for imparting a press force to an adhesive sheet S fed out to the upper surface side of the wafers W to stick the adhesive sheet S to the wafers W; a multi-joint robot 15 (hereinafter, simply referred to as "robot 15"), which is cutting means for, after sticking the adhesive sheet S to the wafers W, cutting the adhesive sheet S along the respective outer edges of the wafers W, and has a function to take out the wafer W from a magazine 200 and transfer the same onto the table 13; a camera 16 as inspection means (which will be described later) for aligning the wafers W and inspecting the cutter blade; a stock device 17 for stocking cutter blades and suction arms; a peeling device 18 for peeling unnecessary adhesive sheet S1 outside of the wafers W from the upper surface of the table 13; and a winding apparatus 19 for winding the unnecessary adhesive sheet S1.

The sheet feed-out unit 12 comprises: a support roller 20 for supporting a rolled raw strip sheet L in which a strip of adhesive sheet S is temporarily stuck on one surface of a strip of a release liner PS; a peel plate 22 with which the raw strip sheet L fed out from the support roller 20 is sharply folded back to peel off the adhesive sheet S from the release liner PS; a collection roller 23 for collecting the release liner PS by winding the same; a plurality of guide rollers 25 to 31 disposed between the support roller 20 and the collection roller 23; a buffer roller 33 disposed between the guide rollers 25 and 26; a tension measuring means 35 disposed between the guide rollers 27 and 28, which includes a load cell 39 and tension measuring roller 40 supported by the load cell 39 and positioned at the base side of the peel plate 22, and sticking-angle maintaining means 37 for integrally supporting the peel plate 22, guide rollers 27, 28, 29, and the tension measuring means 35, which interacts with the press roller 14 to maintain the sticking angle θ of the adhesive sheet S with respect to the wafer W to a constant angle. The guide rollers 27 and 29 are provided with brake shoes 32, 42 respectively. These brake shoes 32 and 42 are arranged so as, when sticking the adhesive sheet S to the wafer W, to be moved toward/away from the corresponding guide roller 27, 29, by means of cylinders 38 and 48 respectively, to nip the adhesive sheet S to restrain the feeding thereof.

Note that the sheet feed-out unit 12, and the tension measuring means 35 and the sticking-angle maintaining means 37, which are constituting the sheet feed-out unit, are the identical to those disclosed in the Japanese Patent Application Laid-Open No. 2005-198806 applied by the applicant of the present invention. Therefore, detailed description thereof will be omitted herein.

Figure 3:
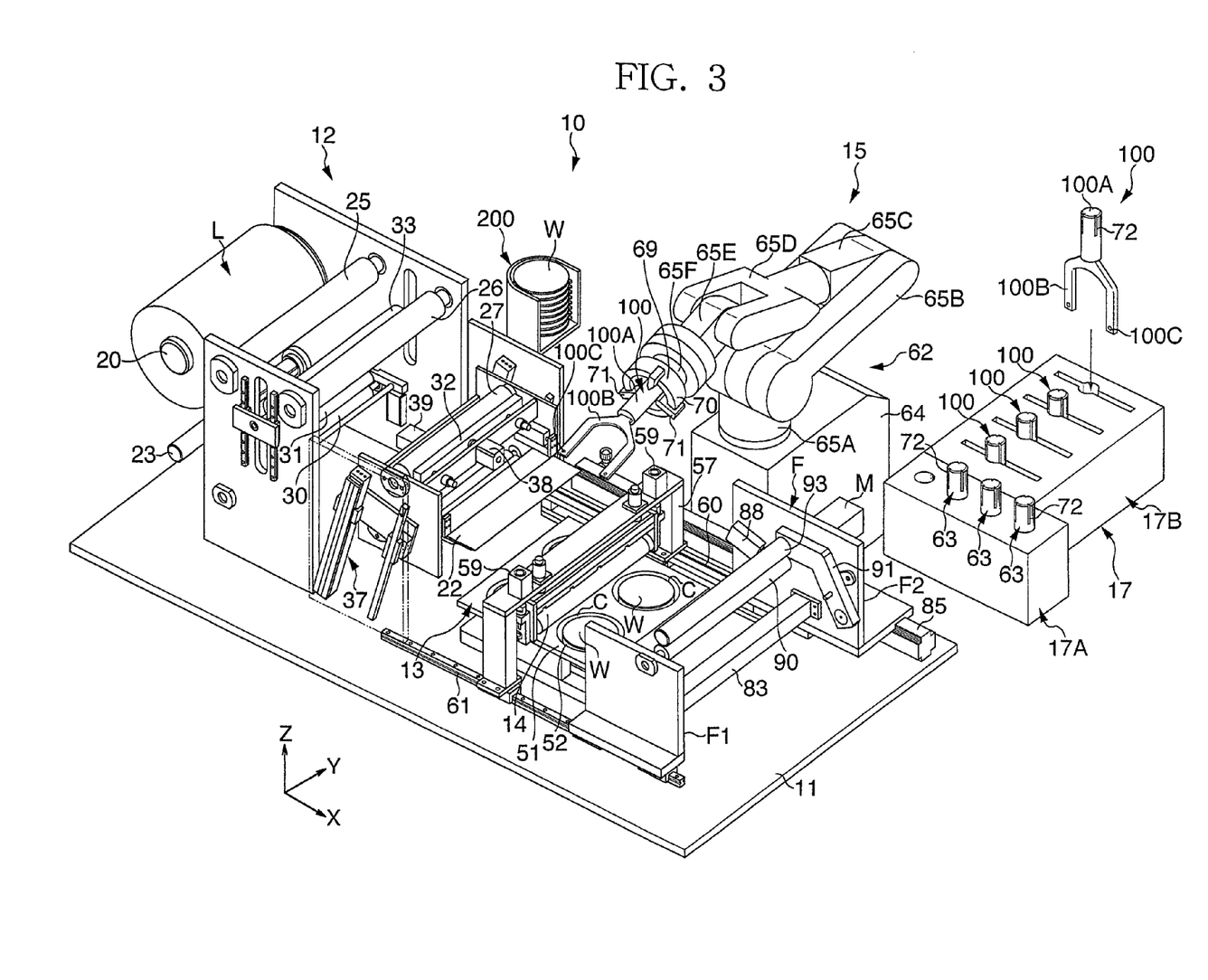
FIG. 3 is a schematic perspective view same as FIG. 2 of a state that a robot holds a suction arm.
Figure 6:
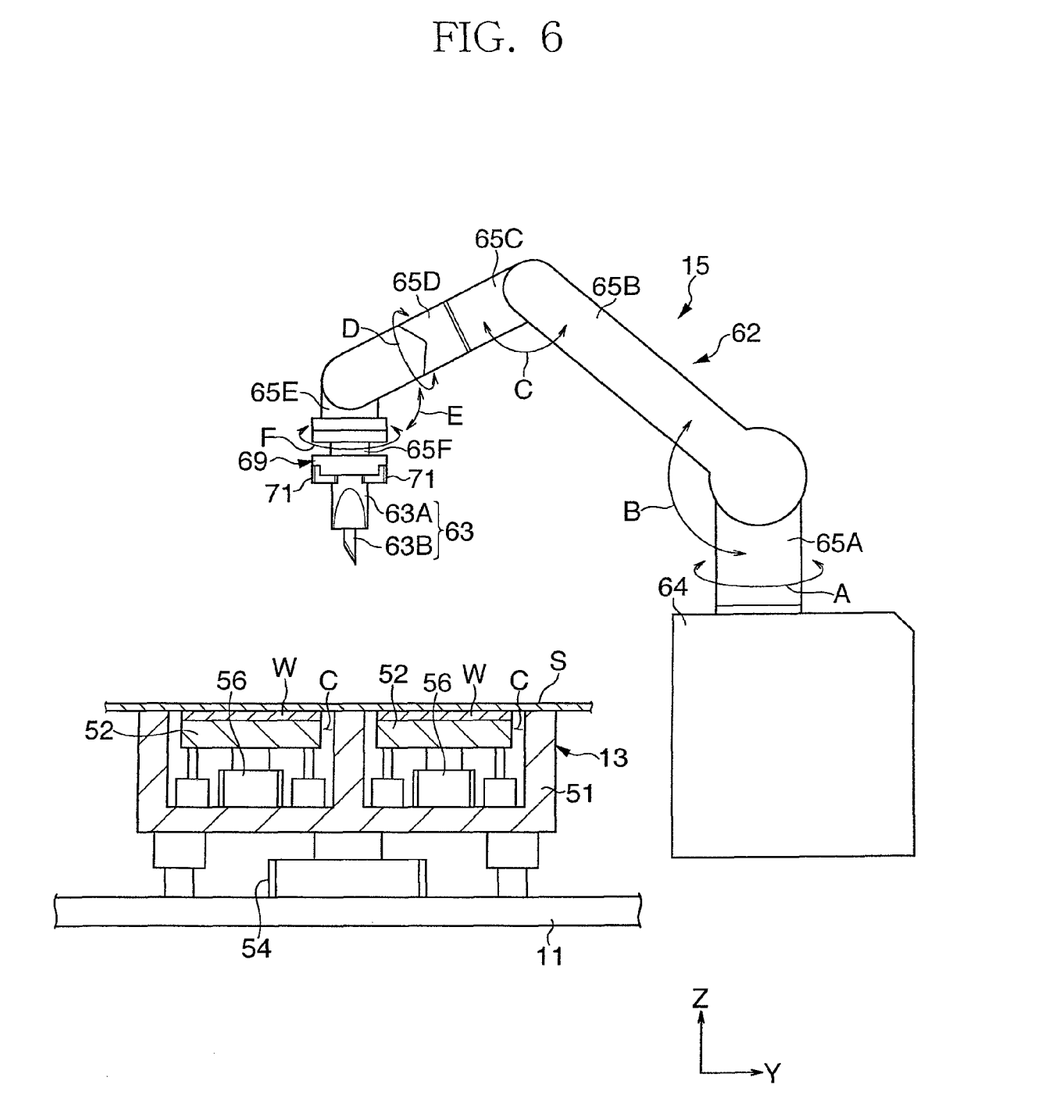
FIG. 6 is a partial cross sectional view of a table and the robot.

As shown in FIGS. 2, 3 and 6, the table 13 comprises an outer table 51 having a substantially square shape in plane view and inner tables 52 each having a substantially circular shapes in plane view, which are disposed at four areas neighboring with each other within an area of the outer table 51. The outer table 51 includes hollow portions at four areas so as to receive the inner tables 52 in a state to form a gap C respectively between the outer periphery of the inner tables 52 and the respective hollow portions, and is arranged so as to move in the vertical direction with respect to the base 11 via a uniaxial robot 54. On the other hand, each of the inner tables 52 is arranged so as to move in the vertical direction with respect to the outer table 51 via a uniaxial robot 56. Owing to this, the inner tables 52 move in the vertical direction in accordance with the thickness of the wafer W with respect to the upper surface of the outer table 51 as the reference position, and the outer table 51 moves in the vertical direction in accordance with the thickness of the sheet S with respect to the press surface of the press roller 14 as the reference. Thereby the press force of the press roller 14 is arranged to be maintained at a substantially constant level. That is, since the upper surface of a plurality of wafers W can be made coincide with the upper surface of the outer table 51, the press force of the sheet S can be maintained to a constant level irrespective of the number or existence of wafers W. Therefore, the sheet S can be stuck free from air bubbles or wrinkles included therein. Note that, in this embodiment, each of the inner tables 52 is arranged to be heated via heating means (not shown). Therefore, in a case where a heat sensitive adhesive sheet is adopted as the adhesive sheet S, the wafers W can be stuck through heating.

The press roller 14 is supported via a portal frame 57. On the upper surface side of the portal frame 57, cylinders 59, 59 are provided. The press roller 14 is arranged so as to move in the vertical direction owing to the operation of these cylinders 59. As shown in FIG. 2, the portal frame 57 is arranged to be movable in the X-direction in FIG. 1 via a uniaxial robot 60 and the guide rail 61.

Figure 5:
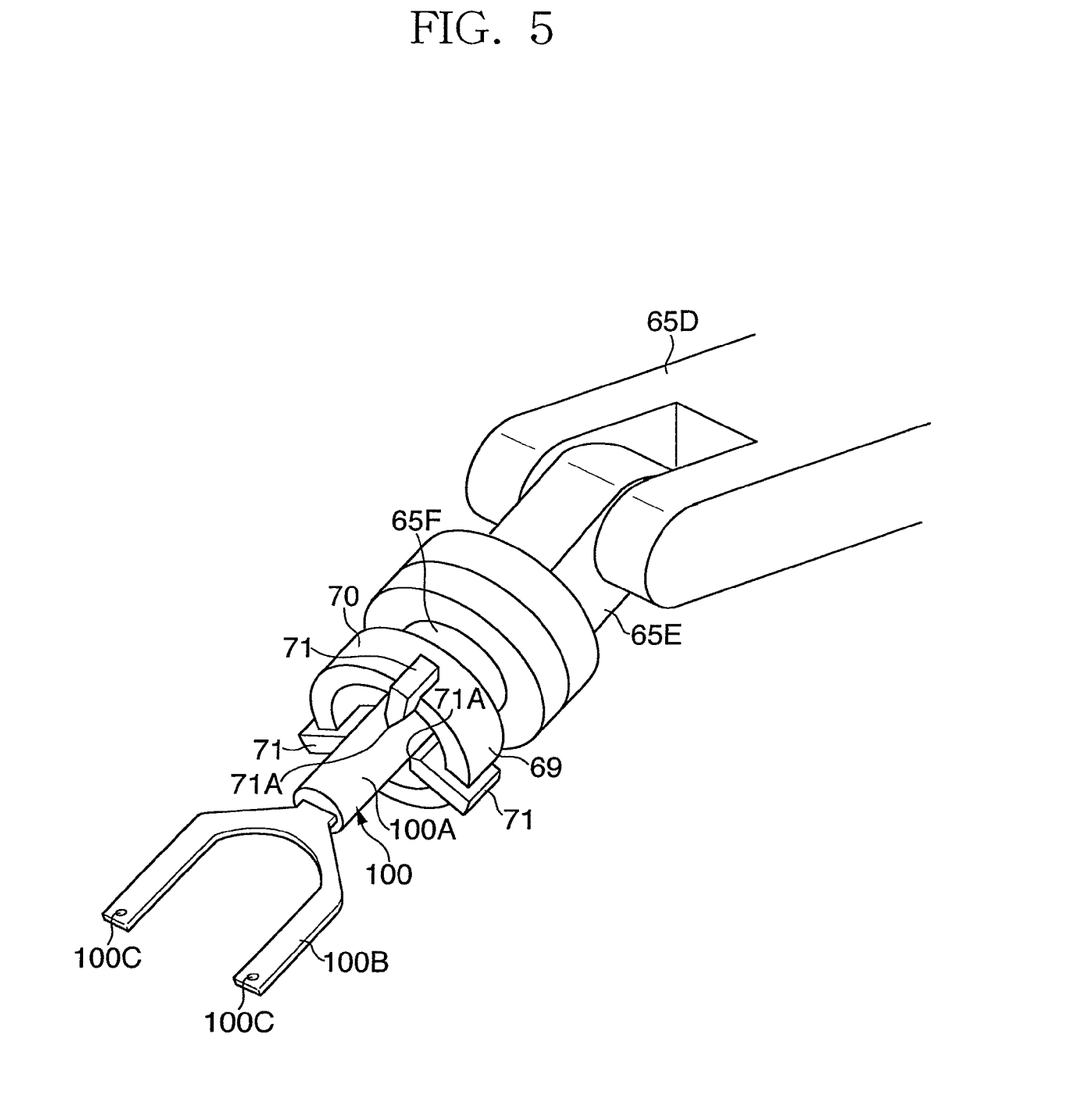
FIG. 5 is an enlarged perspective view showing the front end portion of the robot holding a suction arm.

As shown in FIG. 6, the robot 15 comprises a robot body 62 and a cutter blade 63 or a suction arm 100 supported on the free-end side of the robot body 62 (refer to FIGS. 3 and 5). The robot body 62 includes a base section 64, first to sixth arms 65A to 65F disposed on the upper surface side of the base section 64 so as to be rotatable in the directions of the arrows A to F, and a tool holding chuck 69 attached to the front end of the sixth arm 65F; i.e., on the free-end side of the robot body 52. The second, third and fifth arms 65B, 65C, 65E are provided so as to be rotatable in a Y×Z plane in FIG. 6; and the first, fourth and sixth arms 65A, 65D, 65F are provided so as to be rotatable about the shaft thereof respectively. The robot 15 in this embodiment is controlled by NC (Numerical Control). That is, the movement amount of the respective joints with respect to the workpiece is controlled based on numerical information corresponding thereto, and every movement amount thereof is controlled through a program. Thus, the method adopted is completely different from the conventional cutting means, in which the position of cutter blade has to be changed manually every time when the wafer size is altered. Owing to the numerical control as described above, since the cutter blade 63 can be changed its posture to an arbitrary position, angle or the like, even when a wafer W placed at a different position, the sheet S can be cut along the periphery thereof. Further, the cutter blade 63 is arranged so as to be moved to a position outside of the area above the table 13; i.e., a position beside the table 13 to escape therefrom during non-cutting operation.

Figure 4:
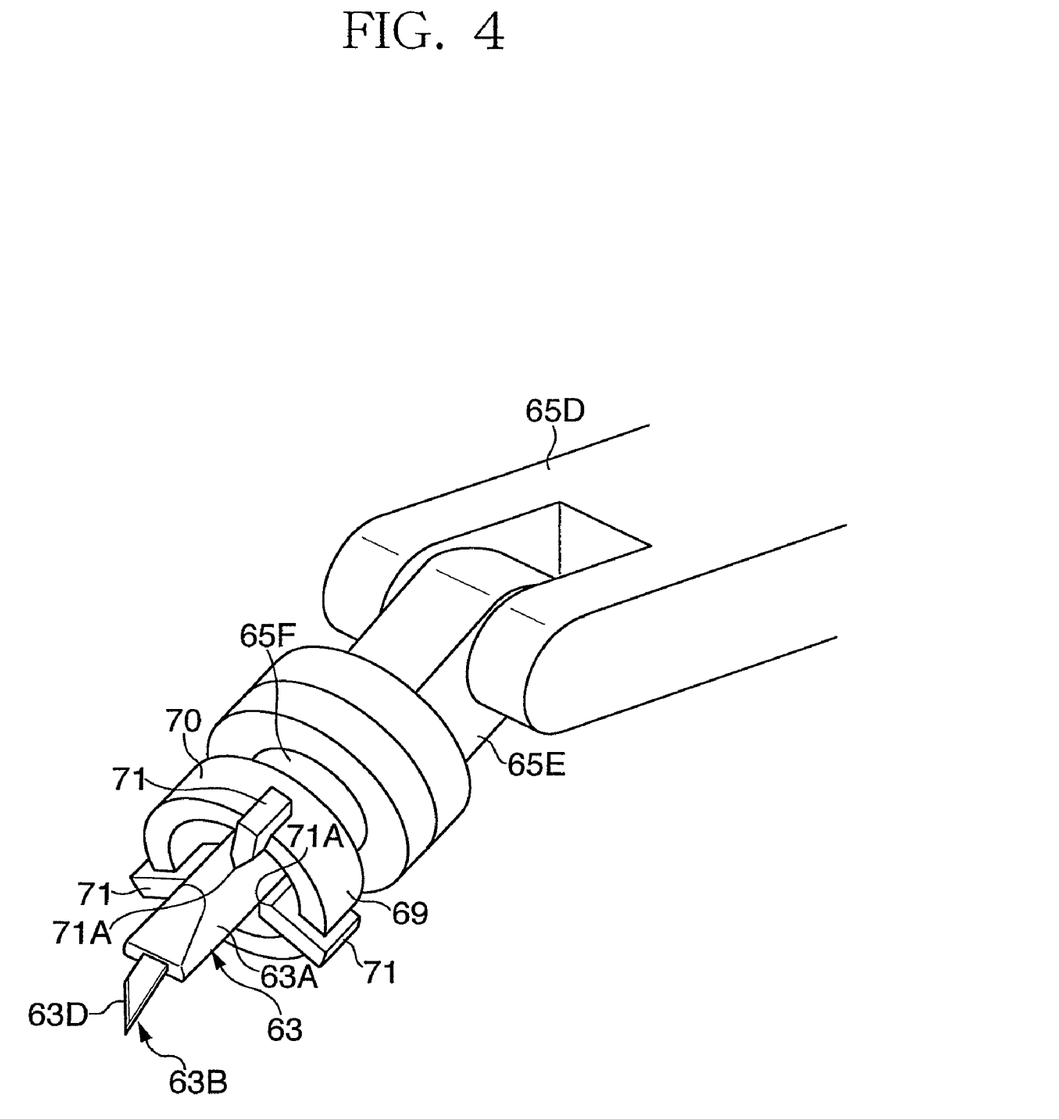
FIG. 4 is an enlarged perspective view showing a front end portion of the robot holding a cutter blade.

As shown in FIGS. 4 and 5, the tool holding chuck 69 comprises a receiver 70 having a substantially cylindrical shape and three chuck claws 71 disposed at positions substantially 120° away from each other in the peripheral direction of the receiver 70, which detachably holds the cutter blade 63 or suction arm 100. Each of the chuck claws 71 has a pointed-edge portion 71A, inner end of which forms an acute angle, and is arranged so as to move forward/backward in the radial direction with respect to the center of the receiver 70 by pneumatic pressure.

The cutter blade 63 comprises a blade holder 63A constituting a base portion and a blade 63B inserted into the front end of the blade holder 63A and fixed thereto. The blade holder 63A has a substantially cylindrical shape, and at the positions substantially 120° away from each other in the peripheral direction of the circumferential surface thereof, grooves 72 having a length extending from the base end to an intermediate portion thereof are formed along the axial direction. The pointed-edge portions 71A of the chuck claws 71 are arranged to engage with these grooves 72, and thereby the position of the cutter blade 63 with respect to the tool holding chuck 69 is maintained to be constant.

The blade holder 63A is equipped with a heater (not shown) and a vibrating device therein, and is arranged so as to heat the blade 63B with the heater as well as to vibrate the blade 63B with the vibrating device. As the heater, a coil heater can be exemplified; and as the vibrating device, an ultrasonic vibrating device can be exemplified.

As shown in FIGS. 2 and 3, the camera 16 is disposed in the vicinity of the robot 15. The camera 16 is arranged to achieve such functions to detect defects on the blade edge of the cutter blade 63; or when the amount of the adhered adhesive exceeds an allowable range, to output a signal to a control device (not shown), and responding to the signal, the robot body 62 automatically replaces the cutter blade 63 with another blade stored in the stock device 17. Also, the camera 16 is arranged to achieve such function to detect V-notch or orientation flat (not shown) of the wafer to align the wafers W when the robot 15 disposes wafers W from the magazine 200 on the respective inner tables 52 of the table 13.

As shown in FIGS. 2 and 3, the stock device 17 includes a first stocker 17A for storing each cutter blade 63 and a second stocker 17B for storing suction arms 100. The robot 15 is arranged so as to transfer the wafer W from the magazine 200 to the table 13 when the suction arm 100 in place of the cutter blade 63 is kept, and to transfer the wafer W after being stuck with the sheet S to the next process. Note that the suction arm 100 comprises an arm holder 100A, which is formed with the same grooves 72 as those of the blade holder 63A, and a Y-shaped arm section 100B, which is attached to the arm holder 100A and is provided with vacuum holes 100C communicating with a decompression device (not shown) in the front ends thereof. Other suction arms 100 are I-shaped arms having different shapes and arms for sucking different size wafers, and there is such an arrangement as suction arms for handling semiconductor wafers of 8 inch, 12 inch or the like can be stocked.

As shown in FIGS. 1 and 2, the peeling apparatus 18 comprises a small diameter roller 80 and a large diameter roller 81. A moving frame F supports the small diameter roller 80 and the large diameter roller 81. A moving frame F comprises a front frame F1 and a rear frame F2, relatively disposed along the Y-direction in FIG. 2, the rear frame F2 being coupled with the front frame F1 via a connecting member 83. The rear frame F2 is supported by a uniaxial robot 85, while the front frame F1 is supported by the guide rail 61. Owing to this, the moving frame F is movable in X-direction in FIG. 2. An arm member 84 supports the large diameter roller 81 as shown in FIG. 1. The arm member 84 is arranged so that a cylinder 88 can move the large diameter roller 81 in the direction closer to/away from the small diameter roller 80.

The winding apparatus 19 comprises: a drive roller 90 supported by the moving frame F; and a winding roller 93, which is supported at the free-end of the rotation arm 91 and abutted on the circumferential surface of the drive roller 90 via a spring 92 to nip the unnecessary adhesive sheet S1. A drive motor M is disposed at the shaft end of the drive roller 90, and it is arranged so that, when the drive roller 90 is driven to rotate by the motor M, the winding roller 93 follows the drive roller 90 to rotate; thereby the unnecessary adhesive sheet S1 is wound thereon. Note that as the wound amount increases, the winding roller 93 shifts rightward in FIG. 1 against the force of the spring 92.

Next, the operation of the embodiment will be described below. In the raw strip sheet L fed out from the support roller 20, the adhesive sheet S is peeled off from the release liner PS at the front end position of the peel plate 22, and the lead end of the release liner PS is fixed to the collection roller 23. On the other hand, the lead end of the adhesive sheet S is fixed to the winding roller 93 of the winding apparatus 19 through the press roller 14 and the peeling device 18. The adhesive sheet S is disposed so as to be faced to the upper portion of the table 13 by the peel plate 22 and the press roller 14, and is sandwiched by the guide rollers 27 and 29 and the brake shoes 32 and 42 so as to restrict the feeding out of the adhesive sheet S. As the press roller 14 rotates to move on the wafer W leftward in FIG. 1, the tension measuring roller 40 is pulled by the adhesive sheet S, and while the load cell 39 measures the tension thereof, a feed out head 49 is lowered at an angle by the sticking-angle maintaining means 37; thus, the plurality of wafers W are stuck with the sheet S at the substantially same time.

The robot 15 holds a suction arm 100 via the tool holding chuck 69; then, sucks and holds the wafer W one by one with the suction arm 100 from the magazine 200, aligns the wafer W with the camera 16 and transfers the wafer W sequentially onto the inner tables 52 of the table 13; and in this state, the adhesive sheet S receives a press force from the press roller 14 and is simultaneously stuck onto the respective wafers W.

After sticking the adhesive sheet S onto the upper surface of each wafer W, the robot 15 performs an exchanging operation to return the suction arm 100 to the second stocker 17B and take the cutter blade 63, and based on the previously inputted movement track data, cuts the adhesive sheet S along the respective outer periphery of the wafers W. After completing the cut operation, the blade edge 63D (refer to FIG. 4) of the cutter blade 63 is inspected by the camera 16. Here, when any damage of the blade edge 63D is detected or the fact that the cutter blade is unacceptable due to excessive amount of transferred adhesive beyond the allowable range is detected, a signal not to use the defective cutter blade 63 and to replace the cutter blade 63 with a new one for the next cutting operation is outputted to the control device (not shown). And in this state, the robot 15 stores the defective cutter blade 63 in the first stocker 17A and performs exchanging operation again to take a suction arm 100, and sucks the wafer W after cutting of the adhesive sheet S and transfers the same to the next process.

When the wafers W are removed from the table 13 via the robot 15, the peeling device 16 winds unnecessary adhesive sheet S1, and the robot 15 transfers again the next wafers W to be stuck with the adhesive sheet S onto the table 13 from the magazine 200. Note that since the winding operation is the identical to the operation disclosed in the Japanese Patent Application Laid-Open No. 2005-198806, detailed description thereof is omitted here.

Therefore, according to the embodiment as described above, a plurality of wafers W on the identical table 13 can be substantially simultaneously stuck with the adhesive sheet S, and the adhesive sheet S can be cut sequentially along the outer periphery of the wafers by the robot 15, thus sheet sticking and cutting operations can be carried out extremely efficiently. Moreover, the robot 15 can transfer the wafers onto the table 13 from the magazine 200, and also can transfer the same from the table 13 to the next process by the robot 15, no independent cutting device or transferring device is required; thus the cost can be reduced.

The best arrangement and method for carrying out the present invention have been disclosed so far. However, the present invention is not limited to the above.

That is, the present invention has been illustrated and described mainly about a specific embodiment. However, it is possible for those skilled in the art to add various modifications, if necessary, to the above-described embodiment with respect to the shape, position and/or disposition without departing from the technical spirit and the range of the object of the present invention.

For example, in the embodiment, the wafer W is objected as the plate-like object. However the present invention is applicable to a case where a sheet is stuck and cut on another plate-like object. Also, the plate-like object is not limited to a circular shape but may have a polygonal shape. Further, the wafer W is not limited to identical size, but wafers W having various sizes can be stuck simultaneously with the sheet.

The invention claimed is:

1. A sheet sticking apparatus, comprising:
   a table for supporting plate-like objects, the table having a base;
   a sheet feed-out unit for feeding out a strip of sheet to upper surface sides of the plate-like objects supported by the table;
   a press roller for pressing said sheet to stick the same to the plate-like objects; and
   cutting means for cutting said sheet along the outer periphery of said plate-like object, wherein
   said table has an area configured to support a plurality of plate-like objects in a substantially identical plane and said sheet can be stuck onto the plate-like objects substantially simultaneously by a sticking operation at one time;
   wherein said table includes an outer table and a plurality of inner tables, the outer table arranged to move in a vertical direction with respect to the base, and the inner tables are arranged to move in a vertical direction with respect to the outer table.

2. The sheet sticking apparatus according to claim 1, wherein said outer table includes a plurality of hollow portions so as to respectively receive said inner tables.

3. The sheet sticking apparatus according to claim 1, further comprising a uniaxial robot configured to move the outer table in the vertical direction.

* * * * *